United States Patent
Sakai et al.

(10) Patent No.: US 8,426,882 B2
(45) Date of Patent: Apr. 23, 2013

(54) WHITE LIGHT-EMITTING LAMP FOR ILLUMINATION AND ILLUMINATING DEVICE USING THE SAME

(75) Inventors: Ryo Sakai, Yokohama (JP); Tsutomu Ishii, Yokohama (JP); Yasuhiro Shirakawa, Yokohama (JP); Masahiko Yamakawa, Yokohama (JP); Yumi Ito, Yokohama (JP)

(73) Assignees: Kabushiki Kaisha Toshiba, Tokyo (JP); Toshiba Materials Co., Ltd., Yokohama-shi (JP)

( * ) Notice: Subject to any disclaimer, the term of this patent is extended or adjusted under 35 U.S.C. 154(b) by 109 days.

(21) Appl. No.: 12/679,030

(22) PCT Filed: Sep. 19, 2008

(86) PCT No.: PCT/JP2008/002587
§ 371 (c)(1),
(2), (4) Date: Mar. 19, 2010

(87) PCT Pub. No.: WO2009/037848
PCT Pub. Date: Mar. 26, 2009

(65) Prior Publication Data
US 2010/0237361 A1   Sep. 23, 2010

(30) Foreign Application Priority Data
Sep. 21, 2007  (JP) .................. 2007-244999

(51) Int. Cl.
*H01L 33/08*  (2010.01)
*H01L 33/44*  (2010.01)

(52) U.S. Cl.
USPC .............. 257/98; 257/88; 257/E33.061

(58) Field of Classification Search ............. 257/88, 257/98, E33.061
See application file for complete search history.

(56) References Cited

U.S. PATENT DOCUMENTS

| 6,252,254 B1 * | 6/2001 | Soules et al. ............. 257/89 |
| 7,271,423 B2 | 9/2007 | Hanamoto et al. |
| 2008/0042156 A1 | 2/2008 | Hanamoto et al. |
| 2009/0166652 A1 * | 7/2009 | Sakai et al. ............. 257/98 |

FOREIGN PATENT DOCUMENTS

| JP | 2000 73052 | 3/2000 |
| JP | 2002 171000 | 6/2002 |
| JP | 2006 299207 | 11/2006 |
| JP | 2007 35951 | 2/2007 |
| JP | 2007-194525 A | 8/2007 |
| JP | 2007-221071 A | 8/2007 |
| JP | 2007 234817 | 9/2007 |

OTHER PUBLICATIONS

Japanese Office Action issued Nov. 13, 2012 in Patent Application No. 2009-533058 with English Translation.

* cited by examiner

*Primary Examiner* — Lynne Gurley
*Assistant Examiner* — Vernon P Webb
(74) *Attorney, Agent, or Firm* — Oblon, Spivak, McClelland, Maier & Neustadt, L.L.P.

(57) ABSTRACT

A white light emitting lamp 1 includes a phosphor layer 5 which emits white light by being excited by light emitted from a semiconductor light emitting element 2. A transparent resin layer 4 is interposed between the semiconductor light emitting element 2 and the phosphor layer 5. The phosphor layer 5 contains, as a green phosphor, a rare earth borate phosphor activated by trivalent cerium and terbium.

15 Claims, 3 Drawing Sheets

US 8,426,882 B2

WHITE LIGHT-EMITTING LAMP FOR ILLUMINATION AND ILLUMINATING DEVICE USING THE SAME

TECHNICAL FIELD

The present invention relates to a white light emitting lamp for illumination and an illuminating device using the same.

BACKGROUND ART

A light emitting diode (LED) is a semiconductor light emitting element that converts electric energy into ultraviolet light and visible light to emit the light, and has advantages such that it has a long operating life with high reliability, and when it is used as a light source, a time which exchanges lamps can be saved. An LED lamp having an LED chip sealed with a transparent resin is used in a backlight of liquid crystal display device, a signal device, switches, a vehicle lamp, and ant illuminating device such as generic illuminations.

As for a color tone of light emitted from the LED lamp, light in a visible range from blue to red according to an intended use can be obtained by combining an LED chip and phosphors having various emission colors. A white light emitting LED lamp (white LED lamp) has rapidly come into wide use as a backlight of liquid crystal display device, a vehicle lamp and the like. Further, since a fluorescent lamp uses mercury, an applicable range of an illuminating device using a white LED lamp that does not use mercury is expected to greatly expand as a substitute for the fluorescent lamp in future.

As white LED lamps currently in actual or experimental use, there have been known an LED lamp in which a blue emitting LED (emission wavelength: 460 to 480 nm) and a yellow phosphor or a mixed phosphor of yellow and red are combined, and an LED lamp in which an ultraviolet emitting LED (emission wavelength: 300 to 430 nm) and a mixture of respective phosphors of blue, green and red (BGR phosphor) are combined. The former lamp is more widely used at present than the latter lamp because the former is superior in brightness characteristic to the latter.

On the other hand, the latter white lamp using the ultraviolet LED has a characteristic such that it is superior in color reproducibility to the former lamp, since it uses three colors of phosphors. Further, when used as an illuminating device, the former lamp can easily obtain a white color, but it has an inferior color rendering property due to a lack of red component, and meanwhile, the latter lamp is expected to improve the color rendering property based on the selection and improvement of the phosphors. The white lamp using the ultraviolet LED is expected to be a mainstream of white LED lamps in future. In particular, there is a great expectation to apply the white lamp to an illuminating device.

When a phosphor that has been commonly used in a conventional fluorescent lamp (FL) or a cold cathode fluorescent lamp (CCFL) excited by mercury gas is applied to a white LED lamp in which a long-wavelength ultraviolet light having an emission wavelength of 300 to 430 nm is an excitation source, the phosphor sometimes does not emit light since the wavelength of excitation source is too long. In particular, a $LaPO_4$:Ce, Tb phosphor used as a green phosphor does not emit light almost at all when being excited by the long-wavelength ultraviolet light having a wavelength of 300 to 430 nm. Accordingly, it has been studied to use a (Ba, Mg) $Al_{10}O_{17}$ phosphor or the like as a green phosphor in the white LED lamp using the ultraviolet LED (refer to Patent References 1, 2).

However, the (Ba, Mg) $Al_{10}O_{17}$ phosphor has an emission wavelength of around 515 nm, so that it can obtain only light on the short wavelength side compared with an emission wavelength (543 nm) of the $LaPO_4$:Ce, Tb phosphor that has been used in the conventional FL or CCFL. When a white LED lamp using such a green phosphor is applied to an illuminating device, there is generated a problem such that the color rendering property cannot be sufficiently enhanced due to a lack of yellow component, as compared with the conventional FL or CCFL. From the above reasons, it is desired to enhance the color rendering property of ultraviolet excitation-type white LED lamp by using a green phosphor containing a lot of yellow components.

Patent Reference 1: JP-A 2000-073052 (KOKAI)
Patent Reference 2: JP-A 2002-171000 (KOKAI)

DISCLOSURE OF THE INVENTION

It is an object of the present invention to provide a white light emitting lamp for illumination capable of improving, when using a BGR phosphor and a semiconductor light emitting element in a combined manner, a characteristic of a green phosphor to enhance a color rendering property, and an illuminating device using the lamp.

A white light emitting lamp for illumination according to an aspect of the present invention includes: a semiconductor light emitting element which emits light having a peak wavelength in a range of not less than 300 nm nor more than 430 nm; a transparent resin layer disposed to cover at least a light emitting surface of the semiconductor light emitting element; and a phosphor layer, disposed on the transparent resin layer, emitting white light by being excited by the light emitted from the semiconductor light emitting element, in which the phosphor layer contains, as a green phosphor, a rare earth borate phosphor activated by trivalent cerium and terbium having a composition represented by a general formula:

$(R_{1-x-y})Ce_xTb_yBO_3$ where R represents at least one element selected from Sc, Y, La, Gd and Lu, and x and y are numbers satisfying $0.03<x<0.3$ and $0.03<y<0.3$.

An illuminating device according an aspect of the present invention includes the white light emitting lamp according to the aspect of the present invention.

EXPLANATION OF NUMERALS

1 . . . white LED lamp, 2 . . . LED chip, 3 . . . wiring board, 4 . . . transparent resin layer, 5 . . . phosphor layer, 6 . . . BGR phosphor, 7 . . . resin layer (transparent resin layer), 11 . . . illuminating device, 12 . . . substrate.

BEST MODE FOR CARRYING OUT THE INVENTION

Figure 1:
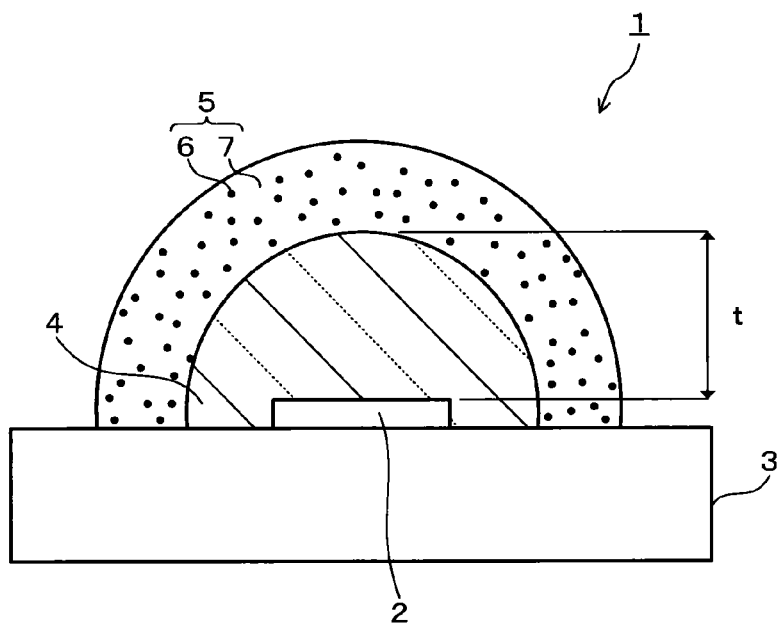
FIG. 1 is a sectional view showing a structure of a white light emitting lamp according to an embodiment of the present invention.

Hereinafter, embodiments for carrying out the present invention will be descried with reference to the drawings. FIG. 1 is a sectional view showing a structure of an embodiment in which a white light emitting lamp for illumination of the present invention is applied to a white LED lamp. A white LED lamp 1 for illumination shown in FIG. 1 includes an LED chip 2 as an excitation source (light source). The excitation source is not limited to the LED chip 2. As an excitation source of the white light emitting lamp, a semiconductor light emitting element such as an ultraviolet emitting diode, a violet light emitting diode, an ultraviolet emitting laser (laser diode), and a violet light emitting laser (laser diode) having a peak wavelength of emission in a range of not less than 300 nm nor more than 430 nm, is used.

As the LED chip 2, a light emitting diode of InGaN type, GaN type, AlGaN type or the like is used. The LED chip 2 has an emission peak wavelength in a range of not less than 300 nm nor more than 430 nm. By using the LED chip 2 having such a peak wavelength together with a later-described BGR phosphor, it is possible to realize a white LED lamp 1 with high brightness and excellent color reproducibility. Here, a light emitting diode as an excitation source is represented as the LED chip 2, and a light emitting lamp with which white light emission is finally obtained is represented as the white LED lamp 1.

The LED chip 2 is mounted on a board 3. As the board 3, a wiring board having a wiring network on a surface or inside thereof is used. Although illustration is omitted, an electrode of the LED chip 2 is electrically connected to the wiring network of the wiring board 3, and accordingly, a direct current voltage is applied to the LED chip 2. The LED chip 2 is covered by a transparent resin layer 4. The transparent resin layer 4 is disposed to cover at least a light emitting surface of the LED chip 2. FIG. 1 shows a structure in which the entire LED chip 2 is covered by a hemispherical-shaped transparent resin layer 4.

On the transparent resin layer 4 that covers the LED chip 2, a phosphor layer 5 is disposed. The phosphor layer 5 includes a resin layer 7 containing phosphors 6 for obtaining white light. The resin layer 7 is formed of a resin having transparency. The phosphor 6 dispersed in the resin layer 7 emits white light by being excited by light emitted from the LED chip 2. As the resin layer 7 that forms the transparent resin layer 4 and the phosphor layer 5, a resin having transparency such as, for example, a silicon resin and an epoxy resin is used.

The phosphor 6 for obtaining the white light is formed of a blue (B) phosphor that emits blue light, a green (G) phosphor that emits green light, and a red (R) phosphor that emits red light by absorbing the light (ultraviolet light or violet light, for example) emitted from the LED chip 2. The phosphor 6 is a mixed phosphor of BGR (BGR phosphor). Note that the BGR phosphor 6 may also contain two types or more of phosphors of the same color, and may also subsidiarily contain a phosphor having an emission color other than blue, green and red (for instance, a yellow phosphor, an orange phosphor, a deep red phosphor, and the like). It is also possible that the BGR phosphor 6 is dispersed in the resin layer 7 in a state where the respective phosphors of blue, green and red are previously combined by a binder.

Electric energy applied to the white LED lamp 1 is converted into ultraviolet light or violet light by the LED chip 2. The light emitted from the LED chip 2 is converted into light with longer wavelength by the BGR phosphor 6 dispersed in the resin layer 7. Since emission lights from the blue phosphor, the green phosphor and the red phosphor that form the BGR phosphor 6 are mixed to be radiated, white light is emitted from the white LED lamp 1.

As the green phosphor among the respective phosphors that form the BGR phosphor 6, there is used a rare earth borate phosphor activated by trivalent cerium (Ce) and terbium (Tb) having a composition represented by a general formula:

$$(R_{1-x-y})Ce_xTb_yBO_3 \tag{1}$$

where, R represents at least one element selected from Sc, Y, La, Gd and Lu, and x and y are numbers satisfying $0.03<x<0.3$ and $0.03<y<0.3$. The Ce and Tb-activated rare earth borate phosphor whose composition is represented by the formula (1) has excellent absorbency of ultraviolet light and violet light whose peak wavelength is within a range of 300 to 430 nm, and besides, it contains a greater amount of yellow components.

Figure 2:
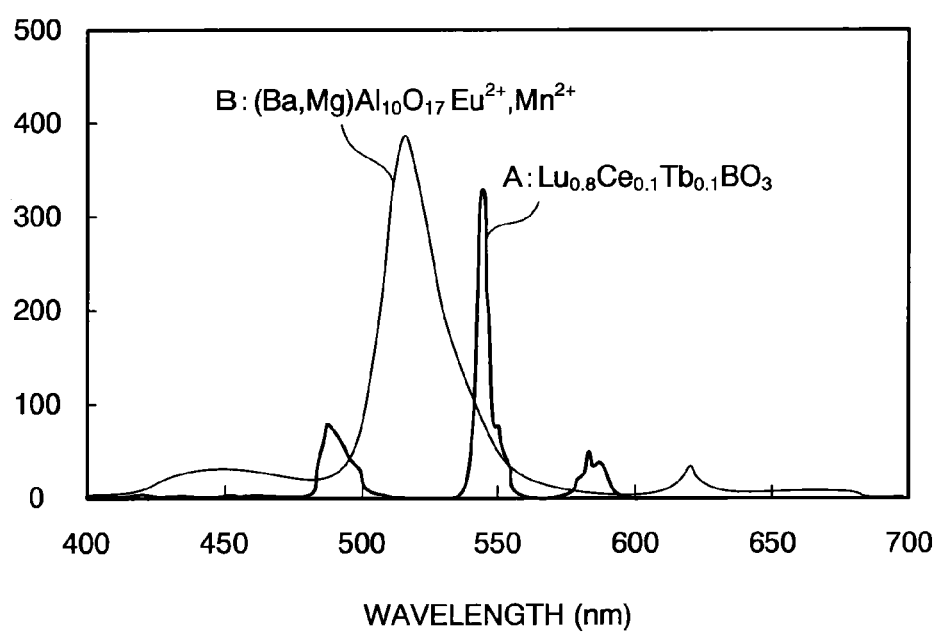
FIG. 2 is a view showing an example of emission spectrum of a green phosphor applied to the present invention by comparing it with that of a conventional green phosphor.

FIG. 2 shows an emission spectrum (A) of the Ce and Tb-activated rare earth borate phosphor ($La_{0.8}Ce_{0.1}Tb_{0.1}BO_3$ phosphor) by comparing it with an emission spectrum (B) of a conventional green phosphor (($Ba, Mg)Al_{10}O_{17}$ phosphor). As is apparent from FIG. 2, it can be understood that the Ce and Tb-activated rare earth borate phosphor has an emission intensity that is increased at 540 to 550 nm, compared with the conventional green phosphor, and it contains a lot of yellow components. Accordingly, it becomes possible to enhance a color rendering property of white light emitted from the white LED lamp 1.

In the green phosphor having the composition represented by the formula (1) (Ce and Tb-activated rare earth borate phosphor), the element R is at least one element selected from scandium (Sc), yttrium (Y), lanthanum (La), gadolinium (Gd) and lutetium (Lu). These elements have a characteristic such that they can easily obtain an $RBO_3$ structure since they are trivalent elements with an ion radius in a range of 0.07 to 0.11 nm.

By substituting a part of such an element R with trivalent terbium (Tb) and cerium (Ce), it is possible to obtain a crystal that produces emission. It is also possible to select two kinds or more of elements from Sc, Y, La, Gd and Lu to use them as the element R. For example, if the total amount of the element R is set to 100 atom %, it is also possible to set the amount of Lu to be not less than 1 atom % and less than 100 atom %, and to set the remaining part to be formed of one kind or two kinds or more of the elements of Sc, Y, La and Gd.

When a part of the element R of $RBO_3$ compound is substituted with $Ce^{3+}$ and $Tb^{3+}$, excitation light from the LED chip 2 (peak wavelength: 300 to 430 nm) is first absorbed by a $Ce^{3+}$ ion, and the absorbed energy is transmitted to a $Tb^{3+}$ ion, which results in generating green light emission. An x value representing an amount substituted by Ce is set to fall within a range of over 0.03 and less than 0.3. A y value representing an amount substituted by Tb is set to fall within a range of over 0.03 and less than 0.3.

When the x value is equal to or less than 0.03, the energy is not fully absorbed in $Ce^{3+}$, so that the energy is not fully transmitted to $Tb^{3+}$, resulting in that the green light emission from $Tb^{3+}$ does not occur sufficiently. On the other hand, when the x value becomes 0.30 or greater, light emission efficiency is decreased. In like manner, when the y value is equal to or less than 0.03, the amount of $Tb^{3+}$ that receives the energy transmitted from $Ce^{3+}$ becomes insufficient, resulting in that the green light emission cannot be obtained sufficiently. When the y value becomes 0.3 or greater, the light emission efficiency is decreased.

A manufacturing method of the green phosphor is not particularly limited, but, a method described below can be cited, for example. First, at least one selected from scandium oxide ($Sc_2O_3$), yttrium oxide ($Y_2O_3$), lanthanum oxide ($La_2O_3$), gadolinium oxide ($Gd_2O_3$) and lutetium oxide ($Lu_2O_3$), cerium oxide ($CeO_2$), terbium oxide ($Tb_4O_7$) and boric acid ($H_3BO_3$) are weighed in a predetermined amount to obtain the composition represented by the formula (1). These are mixed with a baking auxiliary. The raw material mixture is put into an alumina crucible or the like and baked at a temperature of about 1100 to 1400° C. for about three to six hours. After that, the baked material is washed with pure water to remove unnecessary soluble component, and then filtrated and dried, to thereby obtain a desired green phosphor.

As the blue phosphor and the red phosphor among the respective phosphors that form the BGR phosphor 6, various types of phosphors can be used as long as they can effectively absorb the light (ultraviolet light or violet light) emitted from the LED chip 2. In particular, in terms of combination with the green phosphor formed of the Ce and Tb-activated rare earth borate phosphor, the blue phosphor is preferably at least one selected from a chlorophosphate phosphor activated by bivalent europium (Eu) and an aluminate phosphor activated by bivalent europium (Eu). The red phosphor is preferably a rare earth oxysulfide phosphor activated by europium (Eu).

The Eu-activated chlorophosphate phosphor as the blue phosphor is preferable to have a composition represented by a general formula:

$$(M1_{1-x},Eu_x)_{10}(PO_4)_6·Cl_2 \quad (2)$$

where, M1 represents at least one element selected from Mg, Ca, Sr and Ba, and x is a number satisfying 0.001<x<0.5. The Eu-activated chlorophosphate phosphor having the composition represented by the formula (2) has a high absorbency of light emitted from the LED chip 2, and is excellent in combination with the green phosphor having the composition represented by the formula (1).

The Eu-activated aluminate phosphor is preferable to have a composition represented by a general formula:

$$a(M2_{1-x},Eu_x)O·bAl_2O_3 \quad (3)$$

where, M2 represents at least one element selected from Mg, Ca, Sr, Ba, Zn, Li, Rb and Cs, and a, b and x are numbers satisfying 0<a, 0<b, 0.2≦a/b≦1.5 and 0.001<x<0.5. The Eu-activated aluminate phosphor having the composition represented by the formula (3) has a high absorbency of light emitted from the LED chip 2, and is excellent in combination with the green phosphor having the composition represented by the formula (1).

The Eu-activated rare earth oxysulfide phosphor as the red phosphor is preferable to have a composition represented by a general formula:

$$(A_{1-x},Eu_x)_2O_2S \quad (4)$$

where, A represents at least one element selected from La and Y, and x is a number satisfying 0.01<x<0.15. The Eu-activated rare earth oxysulfide phosphor having the composition represented by the formula (4) has a high absorbency of light emitted from the LED chip 2, and is excellent in combination with the green phosphor having the composition represented by the formula (1).

As the blue phosphor, either the Eu-activated chlorophosphate phosphor or the Eu-activated aluminate phosphor may be used, and further, the combination of the phosphors may also be used. As the red phosphor, either a Eu-activated lanthanum oxysulfide phosphor or a Eu-activated yttrium oxysulfide phosphor may be used, and further, a mixture of lanthanum oxysulfide and yttrium oxysulfide may also be used. Each of these phosphors is selected in accordance with an excitation wavelength, a required brightness, a manufacturing cost, and the like.

The white LED lamp 1 in this embodiment includes the phosphor layer 5 containing each of the green phosphor, the blue phosphor and the red phosphor. The respective phosphors efficiently absorb, when ultraviolet light or violet light emitted from the LED chip 2 is irradiated thereto, the ultraviolet light or the violet light and emit light with high efficiency. The green phosphor emits green light with high brightness. The blue phosphor emits blue light with high brightness, and the red phosphor emits red light with high brightness. As a result of this, the colors of these lights are mixed, and white light with high brightness can be obtained. Further, since the light emission from the green phosphor contains a lot of yellow components, it becomes possible to obtain white light having an excellent color rendering property. Such white light is suitably used for illumination in an illuminating device and the like.

When obtaining white light, if there is a too large brightness difference among the respective colors, the white color in which the color with high brightness strongly appears is produced. For example, when only the green color has a high brightness, greenish white light is produced. Namely, in order to obtain the white light with high brightness, all of the respective colors of blue (B), green (G) and red (R) have to have high brightness. Accordingly, a combination of phosphors of respective colors becomes important. Further, in order to improve the color rendering property of the white light, there is a need to enhance a balance of respective colors. Also for this reason, the selection and the combination of phosphors of respective colors become important.

The respective phosphors of blue, green and red are dispersed, as a mixture thereof, for instance, in the transparent resin layer 7. A mixing ratio of the respective phosphors is freely set in accordance with a chromaticity of desired white light. Note that it is also possible to add a phosphor of color other than blue, green and red, according to need. In order to obtain high-quality white light emission in the phosphor layer 5, the mixing ratio of the respective phosphors is preferable to be set such that, when the total amount of the blue phosphor, the green phosphor and the red phosphor is set to 100 mass %, 2 to 50 mass % of the blue phosphor, 2 to 50 mass % of the green phosphor, and the remaining mass % of the red phosphor are mixed.

Further, each of the respective phosphors of blue, green and red preferably has an average particle diameter of 1 μm or greater. By using phosphor powder with an average particle diameter of 1 μm or greater, the absorbency of ultraviolet light or violet light emitted from the LED chip 2 is improved. Therefore, it becomes possible to further increase the brightness of the white LED lamp 1. The average particle diameter of the phosphor powder is more preferably 10 μm or greater. The average particle diameter is set to represent a median (50% value) of a particle size distribution.

As a method of enlarging the average particle diameter of the phosphor, a method of granulating each of the phosphors of one color, a method of granulating a mixture of the phosphors of three colors, and the like can be cited. As another method, there can be cited a method of using a baking auxiliary at the time of baking the phosphors, a method of baking the phosphors at a high temperature for a long period of time, and the like. An upper limit value of the average particle diameter of the phosphor is not particularly limited, but, it is preferably 90% or less than a thickness of the phosphor layer 5 of the white LED lamp 1. If the average particle diameter is greater than the thickness of the phosphor layer 5, a phosphor particle is likely to come off when it is fixed by the resin to form the phosphor layer 5.

Further, the white LED lamp 1 includes the transparent resin layer 4 disposed between the LED chip 2 and the phosphor layer 5. The transparent resin layer 4 is formed to cover at least the light emitting surface of the LED chip 2. As above, by interposing the transparent resin layer 4 between the LED chip 2 and the phosphor layer 5, utilization efficiency of light emitted from the LED chip 2 is enhanced, which enables to improve light emission efficiency of the white LED lamp 1. It is preferable to form the transparent resin layer 4 so that a thickness t from the light emitting surface of the LED chip 2 falls within a range of not less than 0.4 mm nor more than 10 mm.

If the thickness t of the transparent resin layer 4 is less than 0.4 mm, an effect of disposing the transparent resin layer 4 between the LED chip 2 and the phosphor layer 5 may not be sufficiently obtained. If the thickness t of the transparent resin layer 4 exceeds 10 mm, the absorption of light may occur. Also by considering the size when used as an illuminating device, the thickness t of the transparent resin layer 4 is preferably 10 mm or less. The thickness t of the transparent resin layer 4 is more preferably set to 0.8 mm or greater, and even more preferably set to 1 mm or greater. As shown in FIG. 1, when the LED chip 2 is covered by the hemispherical-shaped transparent resin layer 4, a radius of a hemispherical-shaped portion is preferably set to be not less than 0.4 mm nor more than 10 mm.

The white LED lamp 1 is fabricated as follows, for instance. First, a phosphor slurry containing phosphor powders of respective colors is prepared. The phosphor slurry is prepared by, for example, mixing the phosphor powders of respective colors with resins, respectively, and then mixing the mixtures. Alternatively, the phosphor powders of respective colors are previously mixed and then the mixed phosphor is mixed with the resin, to thereby prepare the phosphor slurry. A mixing ratio between the phosphor and the resin is appropriately selected based on the type and the particle diameter of the phosphor and, for example, if the amount of phosphor is set to 100 mass parts, the amount of resin is preferably set to be within a range of 5 to 100 mass parts. A mixing ratio of the respective phosphors is freely set in accordance with a chromaticity of desired white light. As a mixing method, a method of rotating to mix the mixture through convection of liquid, a method of stirring the mixture with a stirrer, and the like can be cited.

Next, a liquid transparent resin is coated on the LED chip 2, and is solidified to form the transparent resin layer 4. The phosphor slurry is coated on the layer, and the resin in the phosphor slurry is solidified to form the phosphor layer 5. The white LED lamp 1 is fabricated. As a coating method of the liquid transparent resin and the phosphor slurry, there can be cited a method in which, for example, the wiring board 3 on which the LED chip 2 is mounted is put into a mold, and from the above, the transparent resin and the phosphor slurry are supplied with a dispenser. Further, a printing method, an injection molding method, and the like may also be used. When a thermosetting resin is used as the transparent resin (including the resin in the phosphor slurry), the liquid transparent resin and the phosphor slurry are coated and then cured by being heated in an oven or the like at a temperature of 100 to 200° C.

Figure 3:
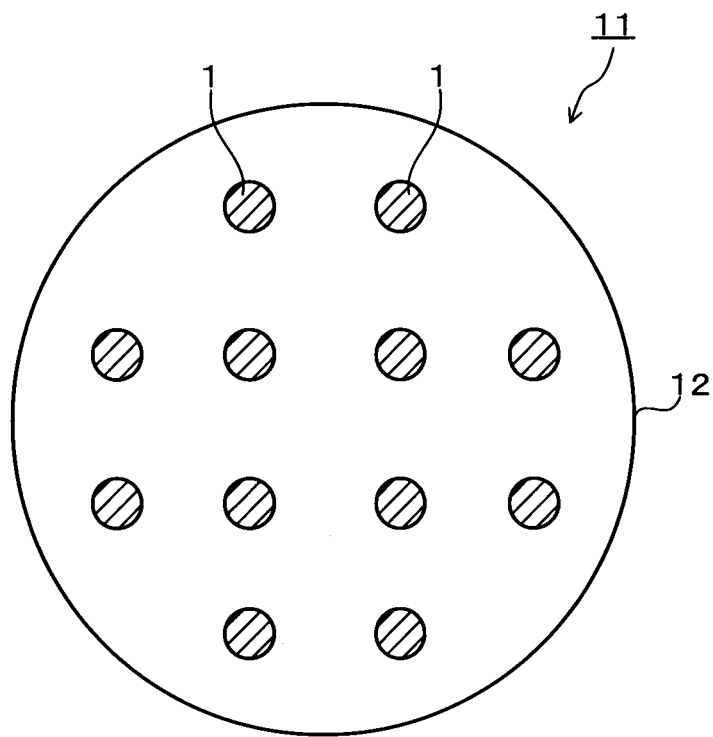
FIG. 3 is a plan view showing a structure of an illuminating device according to an embodiment of the present invention.
Figure 4:
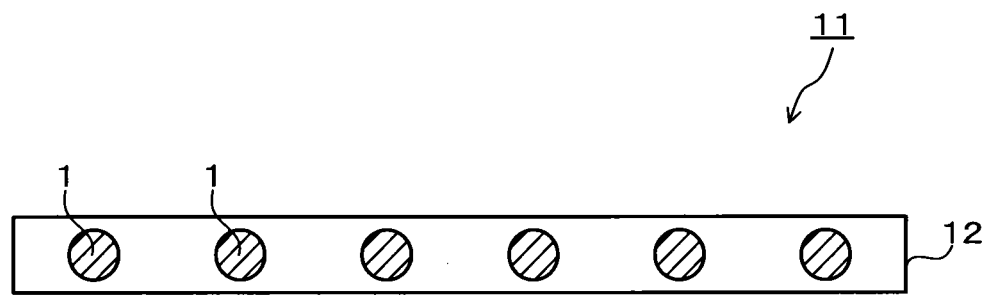
FIG. 4 is a plan view showing a modification example of the illuminating device shown in FIG. 3.

The white LED lamp 1 in this embodiment is excellent in lamp characteristic such as brightness characteristic, color rendering property and color reproducibility. Therefore, the white LED lamp 1 is effectively used as a light source of illuminating device such as generic illumination. The white LED lamp 1 can also be used in lighting application as vehicle lamps, switches and the like. FIG. 3 and FIG. 4 show illuminating devices according to embodiments of the present invention. An illuminating device 11 shown in these drawings includes, as its light source, a plurality of white LED lamps 1.

The white LED lamps 1 are used by being disposed on a substrate 12 in various types of arrangement in accordance with the light amount, the use and the like of the illuminating device 11 to be applied. FIG. 3 shows an illuminating device 11 including a plurality of white LED lamps 1 disposed in a matrix shape on a disk-shaped substrate 12. FIG. 4 shows an illuminating device 11 including a plurality of white LED lamps 1 linearly disposed on a rectangular-shaped substrate 12. The substrate 12 may also be the wiring board 3 of the white LED lamp 1, and may also be a substrate separate from the wiring board 3. The illuminating device 11 using the white LED lamps 1 of this embodiment provides high-quality illumination as a substitute for the conventional fluorescent lamp.

Next, concrete examples of the present invention and evaluation results thereof will be described.

Example 1

First, a Eu-activated chlorophosphate (($Ba_{0.40}$, $Sr_{0.57}$, $Ca_{0.02}$, $Eu_{0.01}$)$_{10}$($PO_4$)$_6$·$Cl_2$) phosphor having an average particle diameter of 40 μm, a Ce and Tb-activated rare earth borate (($Lu_{0.8}$, $Ce_{0.1}$, $Tb_{0.1}$)$BO_3$) phosphor having an average particle diameter of 40 μm, and a Eu-activated lanthanum oxysulfide (($La_{0.89}$, $Eu_{0.11}$)$_2O_2S$) phosphor having an average particle diameter of 40 μm, were prepared as a blue phosphor, a green phosphor and a red phosphor. These respective phosphors were mixed in a ratio so that an emission color of the white LED lamp becomes white of 5000 K (deviation 0). A silicon resin was mixed in the mixed phosphor at a ratio of 60 mass % relative to the total amount, to thereby prepare a phosphor slurry.

Next, on the LED chip (emission peak wavelength: 370 nm, chip size: 0.3 mm×0.3 mm×0.1 mm t) 2 of the white LED lamp 1 having a structure shown in FIG. 1, a silicon resin containing no phosphors was coated, and then the slurry containing the mixed phosphor was coated. This was heat-treated at a temperature of 140° C. to cure the silicon resin, whereby the white LED lamp 1 was fabricated. The transparent resin layer 4 made of the silicon resin containing no phosphors was formed in a hemispherical shape, and a radius thereof was set to 0.8 mm. The phosphor layer 5 was set to have a thickness of 0.5 mm. The obtained white LED lamp 1 was subjected to later-described characteristic evaluation.

Examples 2 to 9

A white LED lamp 1 was fabricated in the same manner as in the example 1 except in that respective phosphors of blue, green and red shown in Table 1 were used. An emission color of the white LED lamp was set to be the same as that in the example 1, and a mixing ratio of the respective phosphor slurries was adjusted so that such an emission color can be obtained. The shapes of the transparent resin layer 4 and the phosphor layer 5 are set to be the same as those in the example 1. Respective emission wavelengths of the LED chip 2 are as shown in Table 2. The obtained white LED lamps 1 were subjected to the later-described characteristic evaluation.

Comparative Example 1

A Eu-activated chlorophosphate (($Ba_{0.40}$, $Sr_{0.57}$, $Ca_{0.02}$, $Eu_{0.01}$)$_{10}$ ($PO_4$)$_6$·$Cl_2$) phosphor having an average particle diameter of 40 μm, a Eu-activated aluminate (($Ba_{0.8}$, $Eu_{0.2}$)($Mg_{0.7}$, $Mn_{0.3}$)$Al_{10}O_{17}$) phosphor having an average particle diameter of 40 μm, and a Eu-activated lanthanum oxysulfide (($La_{0.89}$, $Eu_{0.11}$)$_2O_2S$) phosphor having an average particle diameter of 40 μm, were prepared as a blue phosphor, a green phosphor and a red phosphor, respectively.

These respective phosphors were mixed in a ratio so that an emission color of the white LED lamp becomes white of 5000 K (deviation 0). A silicon resin was mixed in the mixed phosphor at a ratio of 60 mass % relative to the total amount, to thereby prepare a phosphor slurry. A white LED lamp 1 having a structure shown in FIG. 1 was fabricated in the same manner as in the example 1 except in that such a phosphor slurry was used, and the lamp was subjected to the later-described characteristic evaluation. An emission wavelength of the LED chip 2 is 360 nm.

Comparative Examples 2 to 5

A white LED lamp 1 was fabricated in the same manner as in the example 1 except in that respective phosphors of blue, green and red shown in Table 1 were used. An emission color of the white LED lamp was set to be the same as that in the example 1, and a mixing ratio of the respective phosphor slurries was adjusted so that such an emission color can be obtained. Respective emission wavelengths of the LED chip 2 are as shown in Table 2. The obtained white LED lamps 1 were subjected to the later-described characteristic evaluation.

30 mA current was passed through each of the white LED lamps of the examples 1 to 9 and the comparative examples 1 to 5 to light them, and a total luminous flux and an average color rendering index of each of the white LED lamps were measured. Table 2 shows results of these measurements. Note that an emission characteristic of each of the white LED lamps was measured by using a Labsphere SLMS-1021.

TABLE 1

| | BLUE PHOSPHOR | GREEN PHOSPHOR | RED PHOSPHOR |
|---|---|---|---|
| EXAMPLE 1 | $(Ba_{0.40}Sr_{0.57}Ca_{0.02}Eu_{0.01})_{10}(PO_4)_6 \cdot Cl_2$ | $Lu_{0.8}Ce_{0.1}Tb_{0.1}BO_3$ | $(La_{0.89}Eu_{0.11})_2O_2S$ |
| EXAMPLE 2 | $(Ba_{0.50}Sr_{0.47}Ca_{0.02}Eu_{0.01})_{10}(PO_4)_6 \cdot Cl_2$ | $Lu_{0.5}Y_{0.3}Ce_{0.1}Tb_{0.1}BO_3$ | $(La_{0.89}Eu_{0.11})_2O_2S$ |
| EXAMPLE 3 | $(Sr_{0.98}Eu_{0.02})_{10}(PO_4)_6 \cdot Cl_2$ | $Lu_{0.9}Ce_{0.05}Tb_{0.05}BO_3$ | $(Y_{0.94}Eu_{0.06})_2O_2S$ |
| EXAMPLE 4 | $(Ba_{0.80}Eu_{0.20})MgAl_{10}O_{17}$ | $Lu_{0.7}Ce_{0.1}Tb_{0.2}BO_3$ | $(La_{0.89}Eu_{0.11})_2O_2S$ |
| EXAMPLE 5 | $(Ba_{0.50}Sr_{0.47}Ca_{0.02}Eu_{0.01})_{10}(PO_4)_6 \cdot Cl_2$ | $Sc_{0.8}Ce_{0.1}Tb_{0.1}BO_3$ | $(Y_{0.94}Eu_{0.06})_2O_2S$ |
| EXAMPLE 6 | $(Ba_{0.50}Sr_{0.47}Ca_{0.02}Eu_{0.01})_{10}(PO_4)_6 \cdot Cl_2$ | $Y_{0.8}Ce_{0.1}Tb_{0.1}BO_3$ | $(Y_{0.94}Eu_{0.06})_2O_2S$ |
| EXAMPLE 7 | $(Ba_{0.50}Sr_{0.47}Ca_{0.02}Eu_{0.01})_{10}(PO_4)_6 \cdot Cl_2$ | $La_{0.8}Ce_{0.1}Tb_{0.1}BO_3$ | $(La_{0.89}Eu_{0.11})_2O_2S$ |
| EXAMPLE 8 | $(Ba_{0.50}Sr_{0.47}Ca_{0.02}Eu_{0.01})_{10}(PO_4)_6 \cdot Cl_2$ | $Gd_{0.8}Ce_{0.1}Tb_{0.1}BO_3$ | $(La_{0.89}Eu_{0.11})_2O_2S$ |
| EXAMPLE 9 | $(Sr_{0.97}Ca_{0.02}Eu_{0.01})_{10}(PO_4)_6 \cdot Cl_2$ | $Lu_{0.8}Ce_{0.1}Tb_{0.1}BO_3$ | $(La_{0.89}Eu_{0.11})_2O_2S$ |
| COMPARATIVE EXAMPLE 1 | $(Ba_{0.40}Sr_{0.57}Ca_{0.02}Eu_{0.01})_{10}(PO_4)_6 \cdot Cl_2$ | $(Ba_{0.8}Eu_{0.2})(Mg_{0.7}Mn_{0.3})Al_{10}O_{17}$ | $(La_{0.89}Eu_{0.11})_2O_2S$ |
| COMPARATIVE EXAMPLE 2 | $(Ba_{0.50}Sr_{0.47}Ca_{0.02}Eu_{0.01})_{10}(PO_4)_6 \cdot Cl_2$ | $(Ba_{0.8}Eu_{0.2})(Mg_{0.7}Mn_{0.3})Al_{10}O_{17}$ | $(La_{0.89}Eu_{0.11})_2O_2S$ |
| COMPARATIVE EXAMPLE 3 | $(Ba_{0.40}Sr_{0.57}Ca_{0.02}Eu_{0.01})_{10}(PO_4)_6 \cdot Cl_2$ | $La_{0.8}Ce_{0.1}Tb_{0.1}PO_4$ | $(La_{0.89}Eu_{0.11})_2O_2S$ |
| COMPARATIVE EXAMPLE 4 | $(Ba_{0.40}Sr_{0.57}Ca_{0.02}Eu_{0.01})_{10}(PO_4)_6 \cdot Cl_2$ | $Lu_{0.5}Ce_{0.1}Tb_{0.4}BO_3$ | $(La_{0.89}Eu_{0.11})_2O_2S$ |
| COMPARATIVE EXAMPLE 5 | $(Ba_{0.40}Sr_{0.57}Ca_{0.02}Eu_{0.01})_{10}(PO_4)_6 \cdot Cl_2$ | $Lu_{0.95}Ce_{0.02}Tb_{0.03}BO_3$ | $(La_{0.89}Eu_{0.11})_2O_2S$ |

TABLE 2

| | EXCITATION WAVELENGTH OF LIGHT EMITTING ELEMENT (nm) | TOTAL LUMINOUS FLUX OF WHITE LAMP (lm) | AVERAGE COLOR RENDERING INDEX Ra OF WHITE LAMP |
|---|---|---|---|
| EXAMPLE 1 | 370 | 2.98 | 90 |
| EXAMPLE 2 | 370 | 3.15 | 90 |
| EXAMPLE 3 | 370 | 3.27 | 89 |
| EXAMPLE 4 | 370 | 2.86 | 91 |
| EXAMPLE 5 | 320 | 1.49 | 85 |
| EXAMPLE 6 | 400 | 1.42 | 80 |
| EXAMPLE 7 | 340 | 1.23 | 82 |
| EXAMPLE 8 | 380 | 1.11 | 82 |
| EXAMPLE 9 | 370 | 2.92 | 70 |
| COMPARATIVE EXAMPLE 1 | 370 | 2.42 | 60 |
| COMPARATIVE EXAMPLE 2 | 370 | 1.51 | 70 |
| COMPARATIVE EXAMPLE 3 | 360 | 0.11 | — |
| COMPARATIVE EXAMPLE 4 | 370 | 0.16 | — |
| COMPARATIVE EXAMPLE 5 | 370 | 0.24 | — |

As is apparent from Table 2, the respective white LED lamps according to the examples 1 to 9 are superior in both the total luminous flux and the color rendering property to the lamps according to the comparative examples 1 and 2. Note that the Ce and Tb-activated phosphate phosphor used as the green phosphor in the comparative example 3 does not emit light when being excited by long-wavelength ultraviolet light. The green phosphor used in the comparative example 4 and the comparative example 5 cannot obtain green light with high brightness since an activation amount of Ce and Tb thereof is inappropriate. For this reason, the color rendering property could not be measured in the comparative examples 3 to 5.

Comparative Example 10

Figure 5:
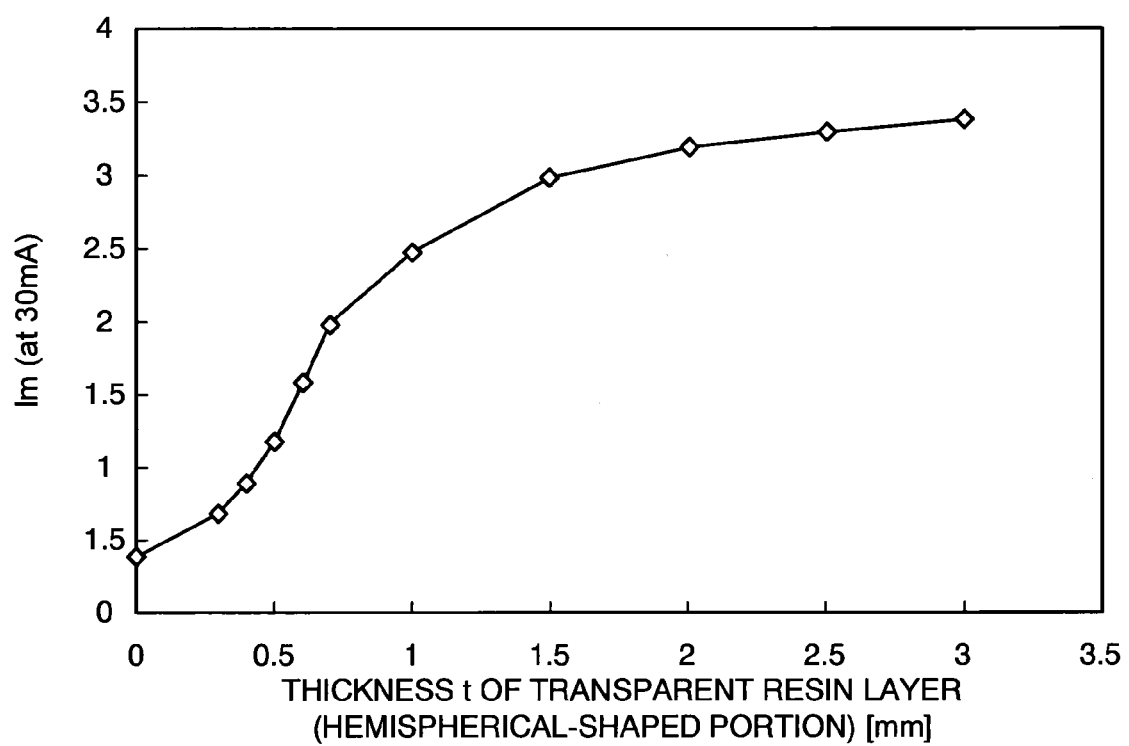
FIG. 5 is a view showing a relation between a brightness of a white LED lamp and a radius of a transparent resin layer according to an example of the present invention.

White LED lamps 1 were respectively fabricated by changing the radius of the hemispherical-shaped transparent resin layer 4 interposed between the LED chip 2 and the phosphor layer 5 in the white LED lamp 1 of the example 1 in various ways. As a comparative example, a white LED lamp 1 which does not have the hemispherical-shaped transparent resin layer 4 was also fabricated in the same manner. 30 mA current was passed through each of the white LED lamps 1 to light them, and a total luminous flux of each of the white LED lamps was measured. FIG. 5 shows results of the measurement. As is apparent from FIG. 5, the radius of the transparent resin layer 4 is preferably set to 0.4 mm or greater. By setting the radius of the transparent resin layer 4 to be equal to or greater than 1 mm, the brightness is further increased.

INDUSTRIAL APPLICABILITY

A white light emitting lamp for illumination according to the present invention uses, as a green phosphor, a rare earth borate phosphor activated by trivalent cerium and terbium containing a greater amount of yellow components, so that it is possible to enhance not only a brightness characteristic but also a color rendering property. Such a white light emitting lamp realizing both high color rendering property and high brightness can be effectively utilized in an illuminating device and the like.

What is claimed is:

1. A white light emitting lamp for illumination, comprising:
    a semiconductor light emitting element which emits ultraviolet or violet light having a peak wavelength in a range of not less than 300 nm nor more than 430 nm;
    a transparent resin layer disposed to cover at least a light emitting surface of the semiconductor light emitting element; and
    a phosphor layer, disposed on the transparent resin layer, emitting white light by being excited by the ultraviolet or violet light emitted from the semiconductor light emitting element,
    wherein the transparent resin layer is provided between the semiconductor light emitting element and the phosphor layer, and has a thickness from the light emitting surface of the semiconductor light emitting element to the phosphor layer in a range of not less than 0.4 mm nor more than 10 mm,
    wherein the phosphor layer includes a green phosphor emitting green light by absorbing the ultraviolet or violet light, a blue phosphor emitting blue light by absorbing the ultraviolet or violet light, and a red phosphor emitting red light by absorbing the ultraviolet or violet light, and the transparent resin layer does not include the green, blue, and red phosphors, and
    wherein the green phosphor comprises a rare earth borate phosphor activated by trivalent cerium and terbium having a composition represented by a general formula:

$$(R_{1-x-y})Ce_xTb_yBO_3$$

where, R represents at least one element selected from Sc, Y, La, Gd and Lu, and x and y are numbers satisfying $0.03<x<0.3$ and $0.03<y<0.3$.

2. The white light emitting lamp for illumination according to claim 1,
    wherein the blue phosphor comprises at least one selected from a chlorophosphate phosphor activated by bivalent europium having a composition represented by a general formula:

$$(M1_{1-x},Eu_x)_{10}(PO_4)_6 \cdot Cl_2$$

where, M1 represents at least one element selected from Mg, Ca, Sr and Ba, and x is a number satisfying the condition of $0.001<x<0.5$, and
    an aluminate phosphor activated by bivalent europium having a composition represented by a general formula:

$$a(M2_{1-x},Eu_x)O \cdot bAl_2O_3$$

where, M2 represents at least one element selected from Mg, Ca, Sr, Ba, Zn, Li, Rb and Cs, and a, b and x are numbers satisfying $0<a$, $0<b$, $0.2 \leq a/b \leq 1.5$ and $0.001<x<0.5$.

3. The white light emitting lamp for illumination according to claim 1,
    wherein the red phosphor comprises a rare earth oxysulfide phosphor activated by europium having a composition represented by a general formula:

$$(A_{1-x},Eu_x)_2O_2S$$

where, A represents at least one element selected from La and Y, and x is a number satisfying $0.01<x<0.15$.

4. The white light emitting lamp for illumination according to claim 1,
    wherein the thickness of the transparent resin layer is in a range of not less than 1 mm nor more than 10 mm.

5. The white light emitting lamp for illumination according to claim 1,
    wherein the transparent resin layer has a shape to cover the entire of the semiconductor light emitting element mounted on a substrate.

6. The white light emitting lamp for illumination according to claim 5,
    wherein the transparent resin layer is formed in a hemispherical shape on the substrate to cover the entire of the semiconductor light emitting element.

7. The white light emitting lamp for illumination according to claim 1,
    wherein the phosphor layer comprises a resin layer containing the green phosphor, the blue phosphor, and the red phosphor.

8. The white light emitting lamp for illumination according to claim 1,
    wherein each of the green phosphor, the blue phosphor, and the red phosphor has a particle shape having an average particle diameter in a range of 1 μm or greater.

9. The white light emitting lamp for illumination according to claim 1,
    wherein the semiconductor light emitting element comprises a light emitting diode or a laser diode.

10. An illuminating device, comprising:
the white light emitting lamp according to claim 1.

11. The illuminating device according to claim 10, further comprising:
a substrate; and
a plurality of the white light emitting lamps disposed on the substrate.

12. The illuminating device according to claim 11,
wherein the plurality of white light emitting lamps are disposed on the substrate in a matrix shape.

13. The illuminating device according to claim 11,
wherein the plurality of white light emitting lamps are linearly disposed on the substrate.

14. The white light emitting lamp for illumination according to claim 1,
wherein each of the green phosphor, the blue phosphor, and the red phosphor has a particle shape having an average particle diameter in a range of 10 μm or greater.

15. The white light emitting lamp for illumination according to claim 1,
wherein the phosphor layer includes the green phosphor in a range of 2 to 50 mass % to a total amount of the green, blue and red phosphor, the blue phosphor in a range of 2 to 50 mass % to the total amount of the green, blue and red phosphor, and balance of the red phosphor.

* * * * *